United States Patent [19]
Roberts

[11] Patent Number: 5,343,616
[45] Date of Patent: Sep. 6, 1994

[54] METHOD OF MAKING HIGH DENSITY SELF-ALIGNING CONDUCTIVE NETWORKS AND CONTACT CLUSTERS

[75] Inventor: Joseph A. Roberts, Hudson, N.H.
[73] Assignee: Rock Ltd., Grafton, N.H.
[21] Appl. No.: 837,357
[22] Filed: Feb. 14, 1992
[51] Int. Cl.$^5$ ............................................. H05K 3/02
[52] U.S. Cl. ........................................ 29/846; 29/847; 29/881; 174/254; 174/255; 439/67; 439/77; 439/85
[58] Field of Search ............... 29/881, 846, 847, 469.5; 439/85, 74, 67, 77; 174/52.2, 52.4, 253, 254, 255

[56] References Cited

U.S. PATENT DOCUMENTS

| | | |
|---|---|---|
| 2,638,660 | 5/1953 | Van Gessel . |
| 2,837,619 | 6/1958 | Stein . |
| 3,147,054 | 9/1964 | Alexander et al. . |
| 3,158,421 | 11/1964 | Hasenauer, Jr. . |
| 3,423,260 | 1/1969 | Heath et al. ................. 156/3 |
| 3,434,208 | 3/1969 | Toomey et al. . |
| 3,488,890 | 1/1970 | Owens et al. . |
| 3,612,745 | 10/1971 | Warren . |
| 3,875,542 | 4/1975 | Holland et al. ............ 333/97 R |
| 3,889,363 | 6/1975 | Davis . |
| 4,020,548 | 5/1977 | Pohl . |
| 4,075,420 | 2/1978 | Walton . |
| 4,080,027 | 3/1978 | Benasutti . |
| 4,089,734 | 5/1978 | Bierig ......................... 156/656 |
| 4,246,563 | 1/1981 | Noerholm . |
| 4,272,753 | 6/1981 | Nicolay ...................... 337/297 |
| 4,306,925 | 12/1981 | Lebow et al. . |
| 4,357,750 | 11/1982 | Ostman ........................ 29/847 |
| 4,406,062 | 9/1983 | Navarro ........................ 29/881 |
| 4,528,259 | 7/1985 | Sullivan . |
| 4,532,152 | 7/1985 | Elarde . |
| 4,651,417 | 3/1987 | Schumacher, III et al. . |
| 4,655,518 | 4/1987 | Johnson et al. . |
| 4,721,550 | 1/1988 | Schumacher, III . |
| 4,775,611 | 10/1988 | Sullivan . |
| 4,840,702 | 6/1989 | Schumacher, III . |
| 5,088,009 | 2/1992 | Harada et al. . |
| 5,097,101 | 3/1992 | Trobough . |

FOREIGN PATENT DOCUMENTS 2136386 2/1973 Fed. Rep. of Germany .

OTHER PUBLICATIONS

Action News, Spring/Summer 1990, Action Technologies, Inc. "Molded Flexible Circuits".
IBM Tech Discl Bull vol. 9 No. 3 Aug. 1966, pp. 236-237 D. G. Pittwood et al.

*Primary Examiner*—Carl J. Arbes
*Attorney, Agent, or Firm*—Davis, Bujold & Streck

[57] ABSTRACT

A conductive network, which can be flexible or rigid, can have self-aligning conductors which connect with corresponding conductors of other networks. The conductive network can be fabricated into densely packed contact clusters for use as electrical interconnectors or circuits. The contact clusters, which can be configured to substantially any shape, are the essential components of high density connector assemblies. The methods and apparatus for making the conductive network and cluster contacts are also described.

50 Claims, 9 Drawing Sheets

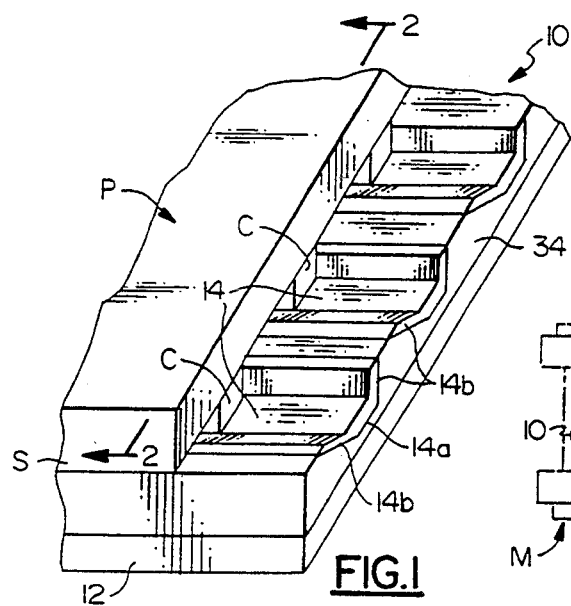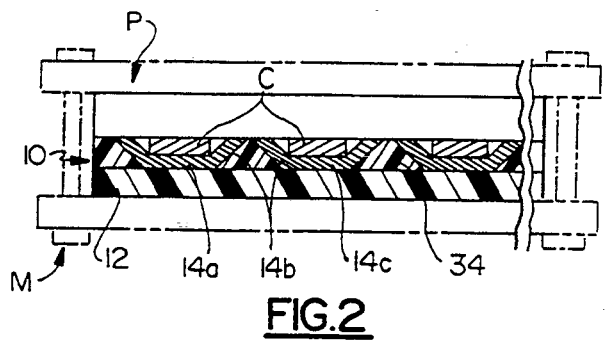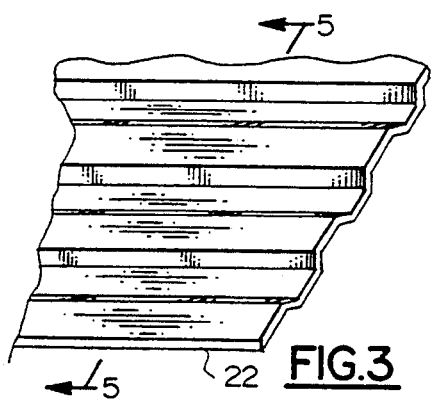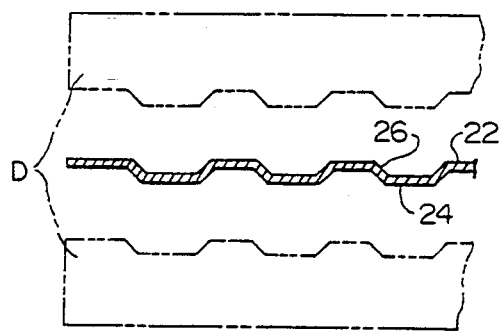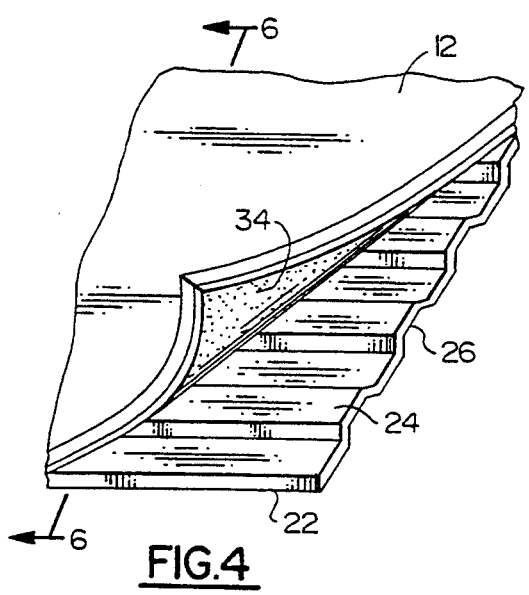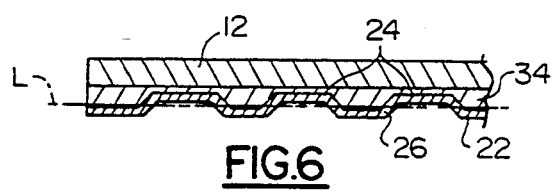

METHOD OF MAKING HIGH DENSITY SELF-ALIGNING CONDUCTIVE NETWORKS AND CONTACT CLUSTERS

This invention generally relates to flexible conductive networks and high density connectors, and their manufacture. In particular, this invention relates to conductive networks which have densely packed conductive paths and connector assemblies, and to a method and apparatus for making the conductive networks and connector assemblies.

BACKGROUND OF THE INVENTION

The growth which the computer and electronics industries have experienced in the last three decades has dramatically increased the demand for conductive networks (for example, printed circuit boards (PCB's)). Manufacturers have responded to this demand by increasing the reliability of their products and by packing more electronics into smaller packages. This requires the use of more densely packed electrical modules and circuits, each requiring multiple interconnections to one another. This requirement to increase printed circuit (PC) board density to accommodate yet another generation of new high power integrated circuit (IC) chips, combined with the requirement to incorporate surface mount technology, continues to drive PC board density to new levels of sophistication. However, there is a practical limit to the density that can be achieved using conventional circuit board connectors.

To perform their defined functions, PC boards must be interconnected electrically to other modules and PC boards within a product. This is often accomplished by means of a flexible printed circuit or jumper cable. These jumpers offer users a unique combination of features, namely, they are reliable, they have unique terminating capabilities, they accommodate surface mount requirements and they are extremely lightweight and flexible. Most importantly, such jumper circuits are capable of very high density. Because of these attributes, users have been willing to pay the relatively high cost of such jumper circuits (due to a high rejection rate) and to suffer the inconvenience and expense of hard soldering these jumpers to the PC boards and modules with which they interconnect.

There is a great need for high quality, low cost, densely packed interconnect cables and equally densely packed connector clusters for coupling the cables to the surface mounted terminals of PC boards and modules. In a typical present day application, a floppy disk drive may require a flexible connection to a recording head whose conductors are only on the order of 0.008 inches on center. This means that the jumper's conductors must have a similar spacing. Also, the new liquid crystal displays have conductors which are even more closely packed (for example, 0.004 inches on center) and which must be interconnected to other PC boards and modules. Still further, there is growing use of ceramic PC boards to accommodate multiple IC chip arrays which also require high density connectors and customer interconnect cables for purposes of terminating those components.

As a direct result of the growth in the circuit board industry, there has been a parallel increase in the volume of environmentally-hazardous chemicals generated by the conventional etching and deposition processes. For example, it is not uncommon for one circuit board fabrication facility to generate 1,000 gallons per day of photoresist stripper and 1,200 gallons per week of developer solution. These toxic wastes must be transported off-site for proper disposal at hazardous waste management sites. Thus, there is an urgent need for a non-chemical method for the manufacture of conductive networks.

It is an object of this invention to provide a relatively inexpensive, high-quality, densely packed, conductive network for use in fabricating rigid or flexible circuit boards, that can be built without the use or generation of environmentally hazardous chemicals.

Another object of the invention is to provide a flexible conductive network having conductive paths which are profiled to self-align with corresponding conductors of other conductive networks. A further object of the invention is to provide contact clusters which can be configured to substantially any shape.

Still another object of the invention is to provide a connector assembly with densely packed contact clusters having the self-aligning capabilities.

A further object of the invention is to provide a connector assembly having contact clusters attached which significantly increase the number of signals that each contact position can interconnect and which are specially profiled to align and to interlock with the conductive paths of networks to which they are connected.

Yet another object of the invention is to provide methods of making conductive networks and contact clusters having one or more of the above advantages.

SUMMARY OF THE INVENTION

This invention relates to flexible conductive networks and contact clusters and a method and apparatus for making them. In particular, this invention concerns high-density, self-aligning conductive networks and contact clusters.

According to this invention, a flexible conductive network is made by shaping a metallic material (for example, copper sheet or foil with or without plated on, or inlaid, contact points) to form a desired conductor pattern on the sheet. (For example, in accordance with a preferred embodiment of the invention, gold can be precisely located on the metallic sheet at a position which, in the finished conductor, will correspond to a contact termination.) A coining process forms ridges on one side of the sheet and troughs on the other corresponding to that conductor pattern. Then, a dielectric substrate is adhered to one side of the sheet with an adhesive filling the spaces between the substrate and the sheet. By properly shaping the dies used in the forming process, the ridges and troughs may be provided with any desired cross-sectional shape or profile.

Next, the exposed metal face of the metal-dielectric lamination is exposed to a removal process, for example a precision grinder which grinds away a pre-determined amount of the material between the ridges coined into the metal layer. This removal process electrically isolates the adjacent ridges which thereupon constitute channeled conductive paths adhered to the dielectric substrate, each of which has a desired cross section or profile. The opposite faces of the ridges constitute troughs which allow the conductive paths to interlock or mate with the corresponding paths on a connecting conductive network when the two networks are connected together for example by clamping. An electronic image analyzer can routinely inspect each conductive network as it exits the precision grinder. This insures the integrity of the coining dies used to form the circuit conductors.

This coining-laminating-grinding process offers significant advantages over the conventional imaging and etching or additive (plating-up) techniques normally used to make PCB or flexible printed circuit conductive networks. It reduces labor costs and produces improved yields. It also allows the use of metal sheets or foils with minor inclusions which cannot be used in a process involving etching because it would result in non-uniform etch rates. Further, in the process of this invention, the throughput is the same for circuits whose metal foils have different thicknesses. This contrasts to the usual imaging-etching process wherein the line speed is directly proportional to the foil weight because it takes longer to etch thick foil than thin foil. The process of this invention results in additional savings because it is a dry process which does not entail the added expenses related to ancillary processing of hazardous materials and chemical disposal.

The same technique can be used to make high-density contact clusters for connector assemblies. In this case, specially profiled conductive paths are designed to interlock or interfit with the contacts or conductors of a mating conductive network. The metal foil can be coined in the same manner described above to form at least one shaped conductor cluster which is attached to, but is electrically insulated from, a metal spring structure. The contact cluster may be manufactured independently and attached to the spring material; however, the precision required to achieve fine line circuitry suggests that the configured spring and contact cluster (shaped to facilitate contact forming and enhance conductor compliance) is preferably made as one laminated structure.

The shaped conductor/contact pattern for a contact cluster can also be created using any one of a number of commercially available techniques, such as an imaging-etching process to print a conductor pattern onto a sheet of metal which will be, or has been previously, laminated to a spring structure, and then subjecting the imaged metal to, for example, an etching process to remove unwanted copper leaving only the contact pattern in place. A contact pattern created by one of these known techniques is then mechanically creased (formed or bent), using a conventional die, to form the desired channels. Other methods that may be used to develop a conductor pattern include but are not limited to plating-up the conductors, screen printing a conductor pattern using a conductive ink. Another method of creating the shaped conductor/contact pattern is to electro form a conductor pattern onto a transfer template and then laminate it to its substrate. However, a preferred method of producing the contact pattern and achieving the desired interlocking or interfitting contacts is similar to the one described above.

More particularly, according to the preferred embodiment of the invention, a metal foil is coined to form ridges that define the desired shape to be formed into contact cluster or clusters. Then, a dielectric substrate is laminated to the foil, either during the forming process or afterwards, with adhesive filling the spaces between the ridges. Also, a foil or sheet of a suitable spring metal (for example, beryllium copper) is laminated to the opposite surface of the dielectric to form a multi-ply laminate. The exposed metal surface of the formed side of the laminate is then subjected to a precision grinding process which grinds away the material between the ridges thereby electrically insulating the resulting, and typically adjacent, conductive paths. Then, the contact cluster or clusters are punched from the laminate and subjected to a precision progressive forming process which forms each contact cluster such that one terminus of the contact cluster is formed into either a female socket-like configuration or a male pin configuration. Each contact cluster, consisting of a support spring and a conductor cluster, is then assembled into a housing, completing the connector.

The contact clusters can be configured in any desired shape. The advantage of this feature is that each contact can be designed to resemble a conventional stamped contact in size and shape. This enables manufacturers to integrate the present contacts into existing connector designs with a minimum amount of tooling.

Also, unlike conventional connectors which employ springs which actually make the electrical connections, the spring metal in the present connector acts primarily as a support structure and does not directly interconnect signal runs. In other words, the spring material may be selected to optimize the characteristics of the spring; the electrical characteristics of that material are irrelevant. In fact, the spring support structure can perform three functions. First, it can provide a support structure on which an array of individual signal conductors or contacts may be mounted. Second, it may act as a compliant spring designed to exert any amount of interconnect force required in a particular application. Third, the spring structure can act as a ground plane or return under the signal conductors. Thus, a connector made in accordance with this invention provides a separable integral interconnection system of high reliability and extremely high contact density. Further, the contact cluster is designed to replace conventional connector contacts and to significantly increase the number of signals that each connector can interconnect in a given amount of space. Thus, for example, one embodiment of the connector can terminate eight signals in the same space required for a conventional stamped connector to terminate just one such signal.

These and other aspects, objects and advantages of the present invention will become apparent from the following detailed description, particularly when taken in conjunction with the accompanying drawings.

BRIEF DESCRIPTION OF THE DRAWINGS

FIG. 1 is a fragmentary axonometric view of a self-aligning conductive network made in accordance with the invention and shown coupled to a printed circuit;

FIG. 2 is a sectional view taken along lines 2—2 of FIG. 1;

FIGS. 3 and 4 are views similar to FIG. 1 showing successive steps involved in making the conductive network of FIG. 1;

FIGS. 5 and 6 are sectional views taken along lines 5—5 and 6—6 of FIGS. 3 and 4, respectively;

DETAILED DESCRIPTION OF PREFERRED EMBODIMENTS OF THE INVENTION

Figure 7:
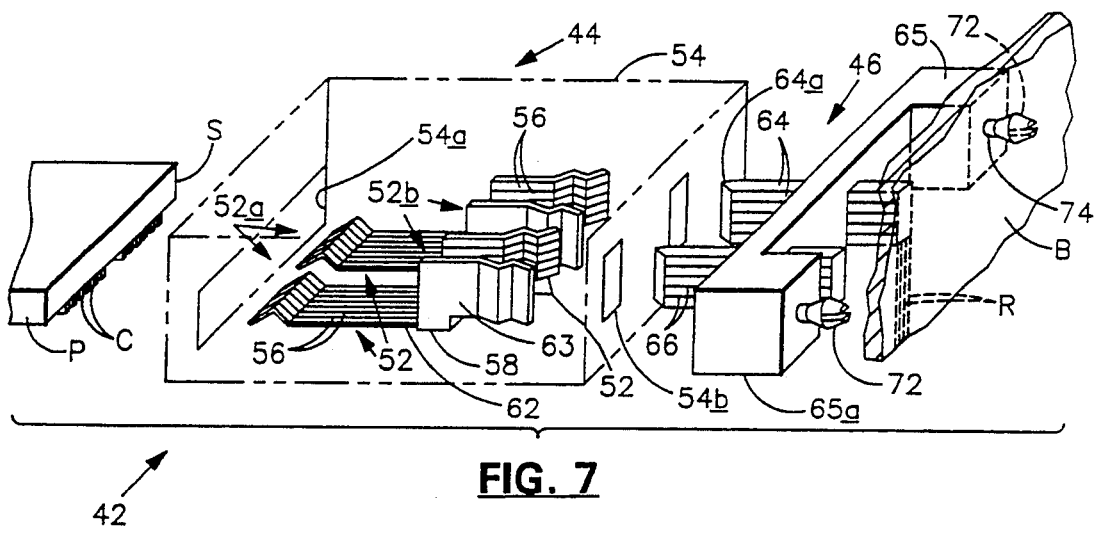
FIG. 7 is an exploded axonometric view of a connector assembly incorporating self-aligning contact clusters having female contact regions.

Referring to FIGS. 1 and 2, a flexible conductive network incorporating the invention is shown generally at 10. The network has a dielectric substrate 12 which carries a densely packed cluster of self-aligning conductive paths 14. Conductive network 10 is shown coupled to a more or less conventional conductive network (for example, printed circuit P) composed of a substrate S which supports a set of printed conductive paths or conductors C which are arranged to interfit and interlock with the conductive paths 14 of conductive network 10. The two illustrated networks are connected electrically and mechanically by clamping them together by a suitable clamp shown in phantom at M in FIG. 2. Each conductive path 14 has a bottom wall 14a and a pair of spaced-apart inclined side walls 14b so that the cross-section of each conductive path 14 is trough-like. The bottom wall 14a is generally recessed from about 0.001 to about 0.005 inches below the surface of the conductive network. Due to the special profile or cross-sectional shape of the conductive paths 14, conductive paths 14 interfit or interlock with the corresponding conductors C of circuit P so as to maintain the conductors of the two networks in perfect alignment. The conductive network 10 is best suited for precisely aligning and maintaining contact with conductors which are less than about 0.15 inches, and preferably less than 0.025 inches, on center. There is no bridging of adjacent conductors despite their close proximity.

The inclined sides 14b of conductive paths 14 guide the corresponding conductors C into proper alignment with conductive network 10 and provide wiping interconnections between the conductors of the two networks. (It is important to note that the conductive network 10 can be used on either the female contact or the male pin of an interconnection, but not both.) The trough-like conductive paths 14 also prevent conductor discontinuity under vibration and make high-density connections between the two conductive networks (for example, 10 and P) possible within an established footprint. Note that by adding additional adhesive 34 compliance between the two networks can be enhanced.

Although conductive paths 14 depicted in FIGS. 1 and 2 are shown as being straight and parallel to one another in a closely packed cluster, the conductive paths may have various patterns and follow different paths along substrate 12, or interconnect, depending upon the particular network application, by appropriately controlling the forming operation described below.

Referring now to FIGS. 3 and 5, according to one embodiment of the invention, to make a flexible conductive network 10, a planar metallic material 22 (for example, copper sheet or foil) of a suitable thickness (for example, about 0.0014 inches) is cleaned and precisely fed between a pair of coining dies, shown in phantom at D in FIG. 5, which coin or emboss foil 22 to form a nonplanar pattern characterized by a set of ridges 24 on one side of the sheet and a corresponding set of troughs or channels 26 in the opposite side of the sheet. Typically, the depth of each trough is from about 0.0015 to about 0.005 inches. Although the ridges 24 in FIGS. 3 and 5 are shown as having a rectangular cross section or profile, the dies D can be designed to provide ridges of any desired cross-sectional shape (for example, hemispherical, ovular, V-shaped, etc). The coining process not only shapes the metallic sheet 22, but also stress-hardens it to prepare the metallic sheet for the lamination step described below.

Figure 6A:
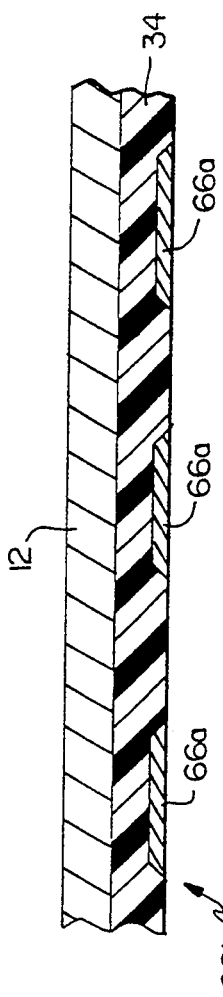
FIG. 6A is a cross-sectional view of a conductive network in which the side walls have been removed.

As shown in FIGS. 4 and 6, the flexible dielectric material 12 (for example, 0.001 inch thick Kapton sheet) can be simultaneously laminated to metallic sheet 22 during the forming process. The lamination process can also take place after the forming process. In the illustrated laminating process, an adhesive material 34 is adhered to one side of dielectric material 12 and the dielectric material is pressed against the side of metallic sheet 22 having the ridges 24, the appropriate heat and pressure is applied for the prescribed amount of time causing the adhesive material 34 to flow and fill the spaces between the ridges as best seen in FIG. 6. Suitable adhesive materials include, but are not limited to, epoxies, polyesters and other application specific adhesives. Alternatively, the flexible dielectric material may be fused (for example, melted) to the metallic sheet, thereby eliminating the need for an adhesive.

The laminate shown in FIG. 6 is then subjected to a conventional precision grinder which mechanically removes a predetermined quantity of unwanted metallic material from the exposed metal side of the laminate (for example, the material below the dashed line L in FIG. 6) sufficient to form electrically insulated conductive paths. As a result of the grinding step, there is formed the pattern of profiled conductive paths 14 of conductive network 10 depicted in FIGS. 1 and 2. The conductive paths may then be cleaned and plated with a desired finish coating (for example, gold, lead, or tin) to complete conductive network 10. The conductive paths may be, for example, 0.012 inches on center.

Also, in accordance with the invention, by changing the substrate or base materials so that they are rigid rather than flexible, a printed circuit board having channeled or "flat" conductors (as described herein) can be easily constructed in accordance with the preferred particular embodiments of the invention. In this embodiment, the dielectric material would be a rigid dielectric. In other respects, the construction of the rigid circuit board corresponds to the construction of the flexible circuitry as illustrated herein. Accordingly while the discussion which follows is generally related to flexible conductive circuits, the principles of the circuit manufacturing processes are equally adaptable to rigid circuit boards.

The conductive paths and their terminating points can be designed to any specific electrical parameter (for example, power and signal) or configuration. For example, the controlled impedance of each conductive path can be selected to suit a particular application by appropriately controlling its configuration and/or its relationship to an electrically conductive support structure (for example, a spring layer 58 or shield) if any. It is important to note that although conductors and/or their terminating points can be plated with any surface finish, if a conductor pattern is not electrically connected to a common plating bus, the gold, by example, must be plated on before the conductive paths are electrically isolated. For example, as described in more detail in connection with FIG. 18, a copper sheet may have gold contact points plated on, or inlaid, at locations that will overlay the terminating point of each conductive path after the desired conductive network pattern is formed.

Further, depending on the use of the conductive network, the conductive paths can be insulated with a pre-windowed protective overlay or solder mask. Suitable insulating materials include, but are not limited to, Kapton, Mylar and Teflon. This protective overlay provides a means to construct multi-layer conductive networks (for example, multi-layer circuit boards) or to add shielding material to the conductive network.

In some applications, the channeled conductors may not be required. For example, in building a flexible printed circuit requiring extreme flexibility, the side wall, despite its thinness, acts to reduce flexibility. In this construction, therefore, channelled conductors are a significant disadvantage. Accordingly, referring to FIG. 6A, the method for removing the unwanted metallic material, for example the use of the precision grinder, is continued until the desired thickness of conductor 66a has been achieved. Therefore, referring to FIG. 6A, a conductor configuration lacking the side walls in accordance with other embodiments of the invention but retaining the advantages of a chemically free, environmentally safe manufacturing process and the other advantages of the process, results in a structure 66b having significant advantages, and low cost.

Unlike some conventional techniques for fabricating conductive networks (for example, etching and deposition), the process of this invention does not use environmentally-hazardous resist, stripper, and developer solutions. Thus, the expense and environmental hazards associated with having the resist, stripper and developer waste solutions transported to toxic waste management sites is eliminated. Further, the process of this invention eliminates common yield problems associated with conventional etched circuits, such as: artwork distortion, scratched or bad acid resistant ink, inconsistent etching caused by dirt or dust, and questionable etching chemistry. Thus, the use of this process will clearly result in a reduction in labor costs and an increase in product yield.

The process of this invention offers additional advantages over conventional etching processes. The foil used in etching processes must be free of impurities to insure uniform etch rates. However, copper foil with minor inclusions can be used with the process described herein. In addition, the etching process is directly affected by the thickness of the foil because the line speed is directly proportional to the foil weight (the thicker the foil, the slower the line feed).

Figure 8:
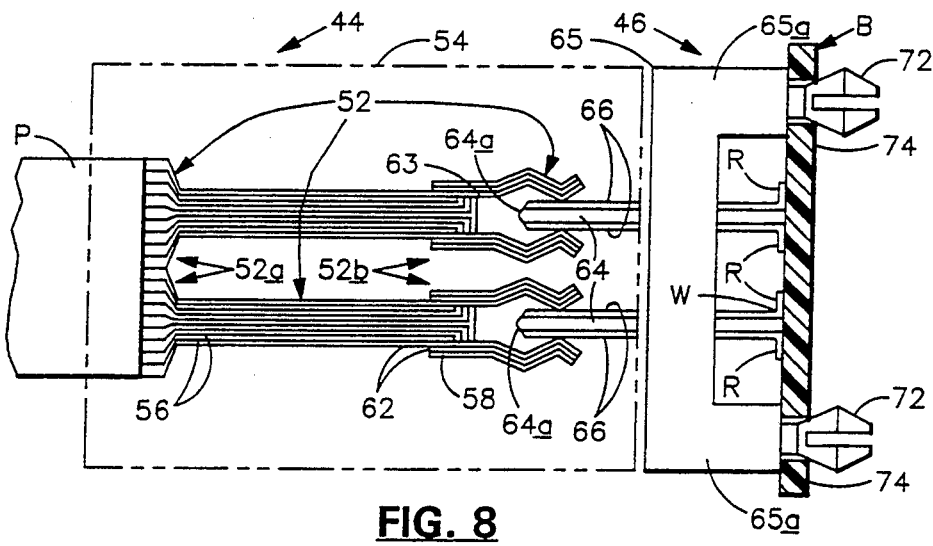
FIG. 8 is a plan view showing the elements of the FIG. 7 assembly coupled together.
Figure 8A:
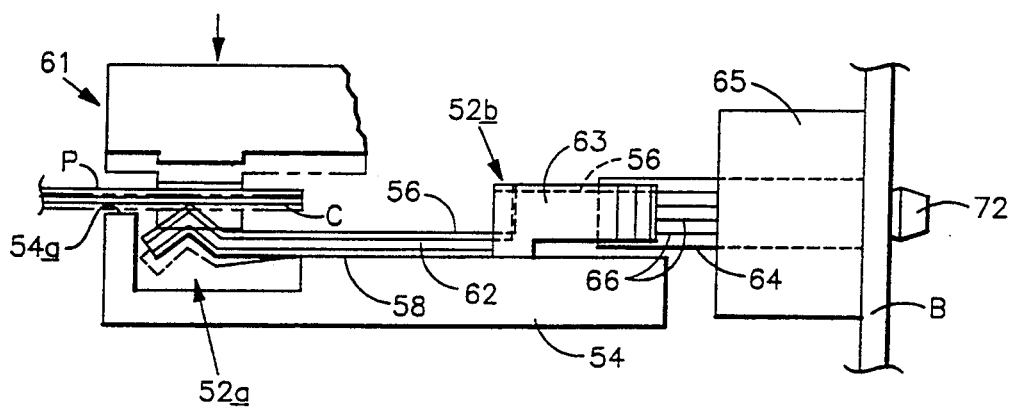
FIG. 8A is an elevational view showing the elements of the FIG. 7 assembly coupled together.

FIGS. 7, 8 and 8A illustrate an example of one particular type of connector assembly with high density contact clusters made using a flexible conductive network preferably manufactured using the coining-laminating-grinding process of this invention. The connector assembly, shown generally at 42, is designed to connect the conductors C of a more or less conventional flexible printed circuit P to the conductive paths or runs R of a more or less standard PC board B. Connector assembly 42 is made up of a female connector section shown generally at 44 which is arranged to be connected electrically and mechanically to printed circuit P so as to terminate the conductors C thereon. The other component of assembly 42 is a male connector section 46 which is connected electrically and mechanically to PC board B so as to terminate the conductor runs R thereon. When the two connector assembly sections 44 and 46 are coupled together as shown in FIGS. 8 and 8A, they establish electrical continuity between the conductors C of circuit P and the conductive runs R of PC board B.

Illustrated connector section 44 has one or more densely packed contact clusters 52 juxtapositioned side-by-side in a housing shown in phantom at 54. Each contact cluster consists of a pattern of closely spaced conductors 56 attached to, but electrically insulated from, a metal leaf spring layer 58 by means of a dielectric interlayer 62. The conductors 56, at their contacts, can have any of a variety of configurations, for example, a juxtaposed flat configuration, a square configuration, a round configuration, etc. The pattern of conductors may be manufactured independently and attached to the spring layer 58.

Spring layer 58 primarily functions as a support structure which (1) supports the integrity of the conductive paths as they proceed through the manufacturing process, (2) adds structural integrity to the conductive network as it is assembled into a connector housing, and (3) adds structural integrity to the conductive network as it engages a mating contact. However, the spring layer can be independently removed from those regions of the contact cluster which require greater flexibility.

In addition, the spring layer can act as a heat sink, thereby allowing circuit designers to control the temperature rise of heat generating elements. In order to have the spring layer function effectively as a heat sink, the base dielectric and adhesive between the spring and the heat generating elements must be removed (pre-windowed) prior to the first lamination step. In this way, the body of a heat generating element (active i chip) can be attached to the metal support structure and effectively disperse unwanted heat.

Alternatively, or in selected embodiments, simultaneously, the spring layer may act as a ground return in those applications requiring controlled impedance or shielding. To do so, the base dielectric and adhesive must be removed (pre-windowed, prepunched, drilled, user skived, etc), from the contact point, prior to the first lamination.

The conductive paths, dielectric layer and spring layer may be individually fabricated and then joined together; however, they are preferably constructed as one laminated structure according to the process described below. Still referring to FIGS. 7, 8 and 8A, the end of each contact cluster 52 proximate printed circuit P (the left-hand end as viewed in the figures) is bent to form an inverted V-shaped clip 52a at that end of each contact cluster 52. A slot 54a is provided in the end of housing 54 adjacent clips 52a so that the end of the printed circuit P can be inserted into the housing. When the circuit P is properly seated in the housing, its conductors C are aligned and make electrical contact with the conductive paths 56 in the contact clusters 52 in the manner as described above in connection with FIGS. 1 and 2. In other words, the conductive paths 56 are shaped or profiled so that the segments thereof at clips 52a interfit and interlock with the conductors C of printed circuit P to assure that the corresponding conductors of the connector section 44 and the circuit P are aligned mechanically and are in electrical contact. The contact clusters 52 and conductors C are thus self-aligning. The circuit may be resiliently engaged or clamped to the contact clusters 52 by a suitable conventional clamping mechanism 61 incorporated into housing 54 as shown in FIG. 8A.

The opposite ends of the contact clusters 52, (the ends facing the connector section 46) can be shaped to form contact regions. In this illustrated embodiment, each contact region comprises a pair of parallel, spaced-apart, clip arms 63 (bent a cumulative angle of about 180° from their original planar position) which are preferably oriented in a plane substantially normal to the plane of said conductive network, such that the pairs of right-hand end segments of the conductive paths 56 (clip arms 63) are biased to a selected spaced apart relationship by the spring layer 58 of the contact cluster. Referring to FIG. 8A, clip arms 63 are bent inward such that the conductive paths 56 on each clip arm face one another, thereby forming a female contact region or socket 52b. Vertically oriented slots 54b are provided in the adjacent end of housing 54 so that the sockets 52b can receive bayonet-type electrical contacts projecting from connector section 46 when that section is coupled to section 44.

Figure 8B:
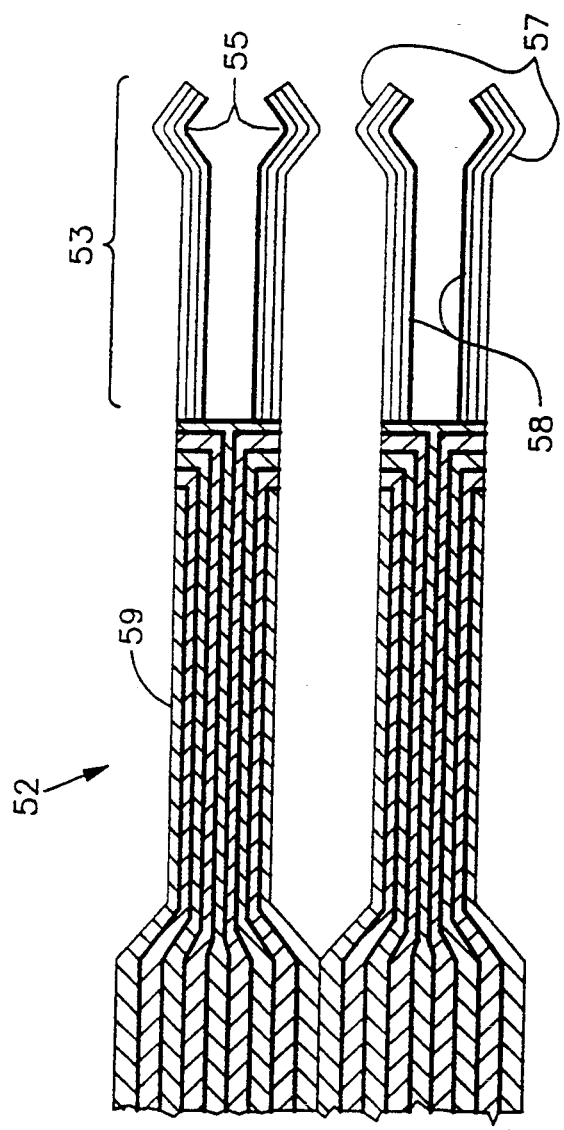
FIG. 8B is a plan view showing two contact clusters which have male contact regions.
Figure 9:
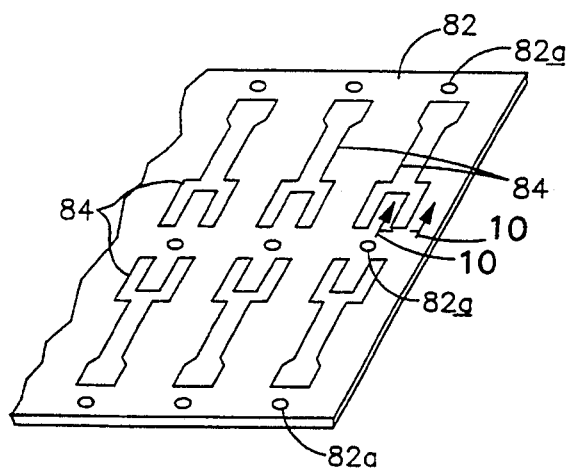
FIG. 9 is a view showing the layout of contact clusters for making the FIG. 7 assembly.

Alternatively, as shown in FIG. 8B, the opposite ends of the contact clusters 52 can be shaped to form male contact regions or contact pins 53. In FIG. 8B, each contact pin 53 comprises a pair of parallel, spaced-apart clip arms 55 (bent outward a cumulative angle of about 180° from their original planar position) which are preferably oriented in a plane substantially normal to the plane of conductive network 59, such that the conductive paths 57 on the clip arms 55 face away from one another. In general, contact pin 53 is designed to be plugged into a receptacle, which is designed to accommodate conventional butt soldering techniques, and will carry multiple (for example, four) conductive paths on each clip arm. Vertically oriented slots are provided in the adjacent end of the connector housing so that the pins can interconnect with the electrical contacts of a circuit board.

As noted above, in other embodiments of the invention, the connections can consist of male or female contact clusters having contacts formed into round, square, or other shaped patterns. Thus, as illustrated in FIG. 18, a plurality of clip arms can be bent to form a round contact pattern 63a.

Referring again to FIGS. 7, 8 and 8A, connector section 46, in the illustrated embodiment, comprises a generally C-shaped base 65 of a suitable dielectric material. Base 65 supports a set of parallel spaced-apart, vertically oriented blades 64, segments of which extend through base 65 between its legs 65a toward housing 54. The number of blades 64 corresponds to the number of sockets 52b in connector section 44. The spacing between the blades is the same as that of the sockets (for example less than 0.10 inches in one illustrated embodiment) so that when the connector sections 44 and 46 are coupled together as shown in FIGS. 8 and 8A, the blades 64 project through slots 54b and are engaged in the sockets 52b in section 44. Preferably, the blades 64 are provided with tapered ends 64a to facilitate these engagements.

Each blade 64 carries a cluster of parallel printed conductors 66 on each face of the blade, the number corresponding to the number of conductors 56 on the corresponding socket clip arm 63. When the two connector sections are coupled together, the conductors 66 on each blade 64 are arranged to interfit with the conductors 56 on the clip arms of the corresponding sockets 52b in connection section 44 in the manner described above in connection with FIGS. 1 and 2 so that reliable electrical connections are established between the conductors in the two connector sections.

Blades 64 extend through the bridging portion of base 65 and are long enough so that when base legs 65a are properly positioned against PC board B as shown in FIGS. 8 and 8A, the right-hand ends of blades 64 butt against the adjacent surface of PC board B such that the blade conductors 66 can be aligned with terminal areas or tabs (not shown) at the ends of the printed circuit runs R on the PC board. To secure the connector base 65 at the appropriate place on the PC board B for such alignments to occur, the base is provided with a pair of bifurcated locating posts 72 at the ends of legs 65a which are arranged to snap into appropriately placed holes 74 on the PC board B. Once the base 65 has been secured to the PC board, the tab conductors 66 can be butt soldered to the corresponding conductor runs R of the PC board B as shown at W in FIG. 8.

Thus, when connector sections 44 and 46 are connected to the respective circuits P and B and are coupled together as shown, reliable fine-line electrical connections are established between the conductors C of circuit P and the conductive runs R of PC board B.

It is important to note that although the conductive networks of the contact clusters 52 are preferably made using the coining-laminating-grinding process described above, the conductive networks can be fabricated by any one of a number of processes including: (1) vacuum forming the conductive network onto a sheet of dielectric material using a template; (2) electro forming the conductive network onto a transfer template and then transferring to a flexible or rigid substrate using conventional adhesives and laminating techniques; and (3) mechanically creasing or heat forming conductive paths into conventionally fabricated conductors.

Figure 10:
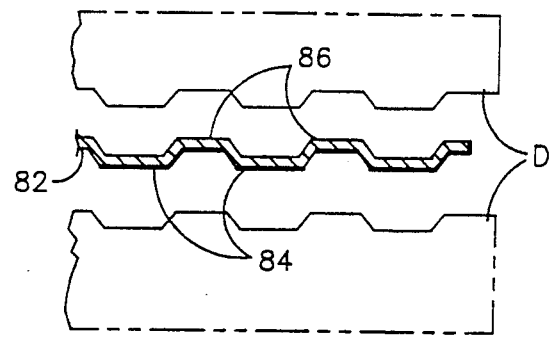
FIG. 10 is a sectional view, greatly enlarged, taken along lines 10—10 of FIG. 9 and illustrating the die used to form the non-planar contact cluster.

The coining-laminating-grinding process depicted in FIGS. 9 to 15 is similar to the process used to make the conductive network illustrated in FIGS. 1 and 2. In accordance with this process, a sheet 82 of metallic material (for example, 0.0014 inch copper foil) preferably with two parallel strips of inlaid pressure fused gold 56a (FIG. 15) suitable for electric contacts is drawn from a roll, cleaned and fed precisely between a pair of coining dies D which form a pattern of ridges 84 and waste areas 86 on opposite sides of the sheet, the pattern corresponding to the pattern of contacts or conductors 56 in connector section 44. The inlaid gold strips will form contact areas as described in more detail below. Preferably, the sheet 82 is provided with sprocket holes 82a which register with sprockets in a feed mechanism (not shown) so that the strip is guided precisely to the proper location between dies D. This coining process embosses the unwanted or waste sheet areas 86 approximately 0.002 to 0.005 inches above the surface of ridges 84 as shown in FIG. 10. The forming process effected by the dies D also stresshardens the raised waste areas 86 of the foil between the ridges which strengthens the sheet 82 in preparation for the inline laminating process described below.

Figure 11:
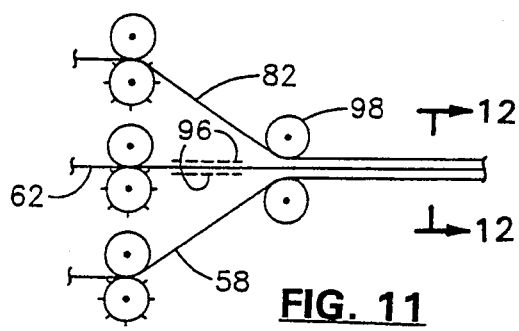
FIG. 11 is a diagrammatic view illustrating the laminating step in the manufacture of a contact cluster.
Figure 12:
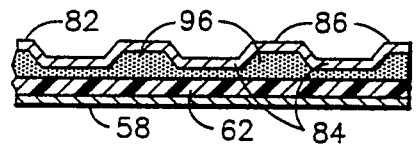
FIG. 12 is a sectional view, greatly enlarged, taken along lines 12—12 of FIG. 11.

As shown in FIGS. 11 and 12, the preformed metallic sheet 82 is next registered to a sheet 58 of spring metal (for example, beryllium copper) drawn from a roll, such that the waste areas 86 of the foil face away from the sheet 58. Fed inbetween sheets 58 and 82 is a sheet 62 of a flexible dielectric material (for example, 0.001 polyester) which may be pre-punched (windowed) to expose ground connections and/or pressure fused interconnecting points. If desired, pressure fused interconnections can be made as the two conductive sheets, each having opposing stress hardened domes located at the points to be interconnected, pass between the high pressure nip rollers. This is accomplished as the two sheets of conductive material are registered to each side of the pre-punched flexible dielectric material. The opposing stress hardened domes are pressure fused as they pass through the high pressure nip rollers. In addition, each interconnect is structurally reinforced through the laminating process as described in more detail below.

An adhesive material 96, in this illustrated embodiment, is provided on both faces of sheet 62 so that when the three sheets are pressed together by the nip rollers 98, they become laminated forming a single composite sheet consisting of the conductive top layer 82, the intermediate dielectric layer 62 and the bottom spring layer 58, with the adhesive material 96 filling the spaces under the metal waste areas 86 of layer 82, as best seen in FIG. 12. In other embodiments, the dielectric layer 62 can be fused or melted without causing conductor distortion (swim), thereby eliminating the need for an adhesive between layer 62 and the conductive top layer 82.

Figure 13:
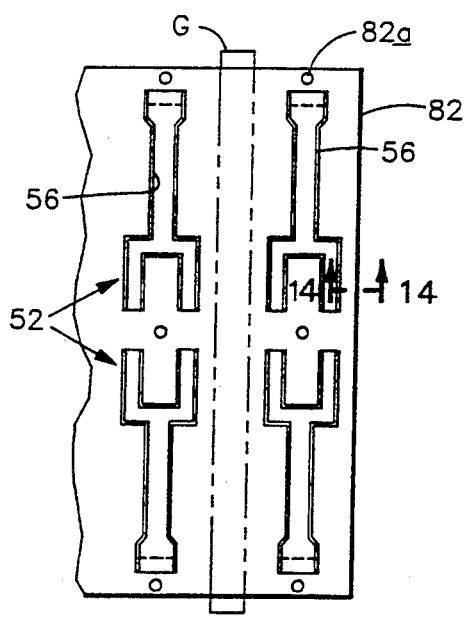
FIG. 13 is a top plan view of a laminate material illustrating the result of the precision grinding step in the manufacture of the contact cluster assembly.
Figure 14:
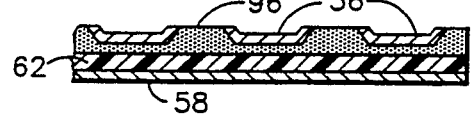
FIG. 14 is a sectional view, greatly enlarged, taken along lines 14—14 of FIG. 13.

According to the next step of the process, the laminate is fed through a precision grinding station shown in phantom at G in FIG. 13 which removes some (for example, 0.9015 inches) of the raised waste areas 86 of sheet 82, as well as some of the adhesive material 96 thereby electrically insulating the adjacent ridges 84 and establishing the final shapes of those ridges which now correspond to the patterns of conductive paths 56 of the contact clusters 52 in the connector section 44 shown in FIGS. 7 to 8A. After being cleaned, the laminate illustrated in FIGS. 13 and 14 is subjected to a stamping and forming process using progressive dies, the various steps in this process being illustrated in FIG. 15.

Figure 15:
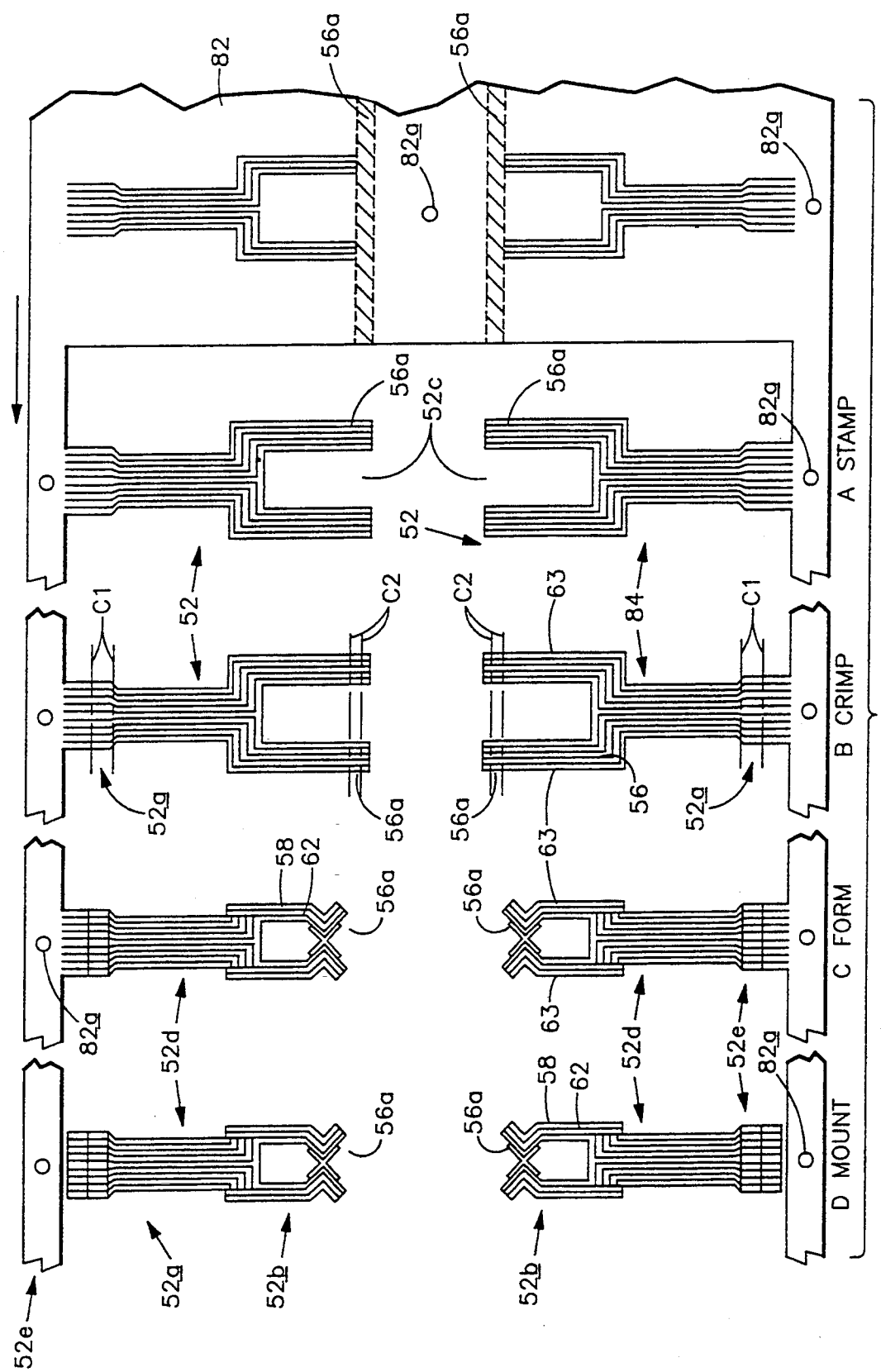
FIG. 15 is a top plan view illustrating the successive steps involved in forming the shaped contact clusters of a connector assembly.

Referring to FIG. 15, wherein the parallel strips of inlaid pressure fused gold 56a will act as terminal contacts as described hereinafter, at station A of the process, the laminate is stamped to remove unwanted material around the contact clusters 52 including the strip of material 52c between opposing pairs of clusters that contains the central line of sprocket holes 82a. Next, at station B, the laminated strip is crimped along lines C1 and C2 which define the clips 52a and socket clip arms 63 (FIG. 8).

The laminated sheet then advances through a forming station C which, in the illustrated embodiment, bends the clip arms 63 of each cluster 52 through a cumulative angle of about 180° and preferably to a plane where each is normal to the laminate body to form the sockets 52b. (In other embodiments of the invention, the clip arms 63 can be bent to form round or square contacts, for example, such as the round contact cluster of FIG. 18.) Finally, after being cleaned and if desired, provided with a suitable surface coating (where the inlaid contact material is not provided), the succession of formed connectors 52d is advanced to a mounting station D at which each connector 52d is registered and adhered to a housing 54 (FIG. 8A). The individual clusters 52 are then separated from the remaining side edge margins 52e of the laminated strip which have functioned as a stabilizing lead frame during the stamping and forming process. The inlaid or plated gold strips, because of the accurate registration, according to the invention, are positioned to act as contact terminals for the structure.

It is noted from the foregoing that the process of this invention allows the production of fine-line flexible conductive networks (for example, circuits and jumpers) and conventional, high volume, printed circuit boards at relatively low cost. The same principles may be followed to produce densely-packed contact clusters for incorporation into connectors used to interconnect such fine-line circuits.

Figure 16:
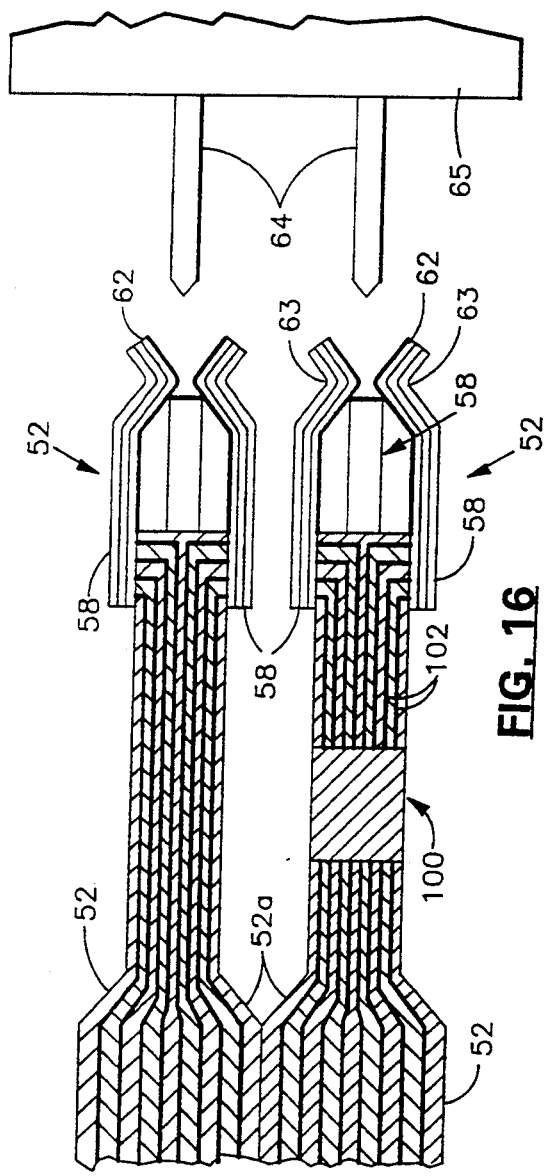
FIG. 16 is a plan view of a flexible conductive network including a circuit device making connection between the conductors of the network.

Referring to FIG. 16, it is not necessary that the conductors formed in accordance with the invention actually form through electrical paths from one connection point, for example runs R on printed circuit board B to a second connection point, for example conductors C. The unique construction of the circuit allows for the connection thereto of active or passive circuit devices thereby enabling a connection block housing such as housing 54 to provide more than mere connectivity between electrical nodes or points. The conductive paths of the circuit function as female receptacles into which the male conductor of a circuit device may be positioned. This self aligning/locking capability is of particular importance when assembling fine line (0.008 inches on center) components. Thus, referring to FIG. 16, an integrated circuit, or other active or passive circuit 100 can be connected in circuit with various of the conductive paths 102 thus completing active or passive connections between conductive paths.

Such integrated circuits can act as amplification devices, impedance matching devices, computer devices, etc. and can have a broad range of applicability. Indeed, such devices have unlimited scope depending upon the design and application of the flexible conductive network to which they are attached.

In a particular embodiment for terminating a device conductor terminal, a portion of the recessed conductive paths can act as solder wells, that is, contain a volume of solder. Upon mounting (and heating), the solder well(s) provide a permanent connection to the device conductor(s), and the conductor recess provides tolerance for any non-planarity between the device and the conductor, which, being self-aligning, aids in the placement of the conductor terminals. The recessed conductors also help to reduce solder bridging (between conductors) and solder balls.

Figure 16A:
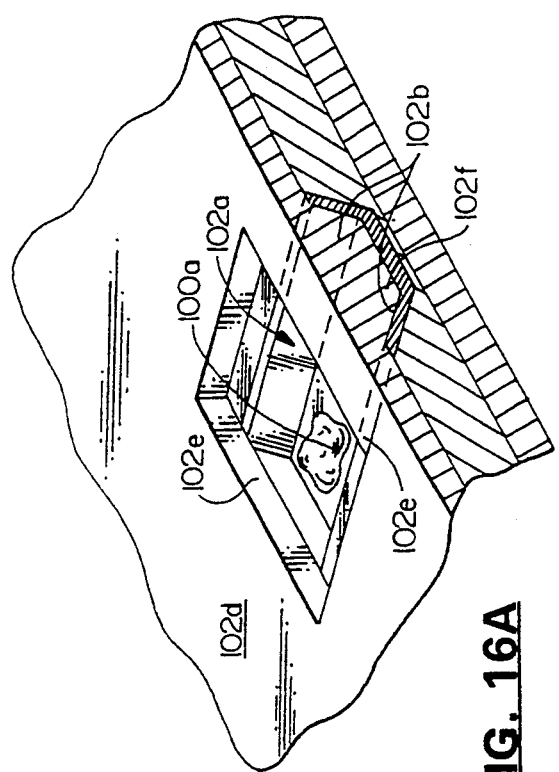
FIGS. 16A and 16B are perspective and top views respectively illustrating the use of the conductive network for holding a reservoir of solder.
Figure 16B:
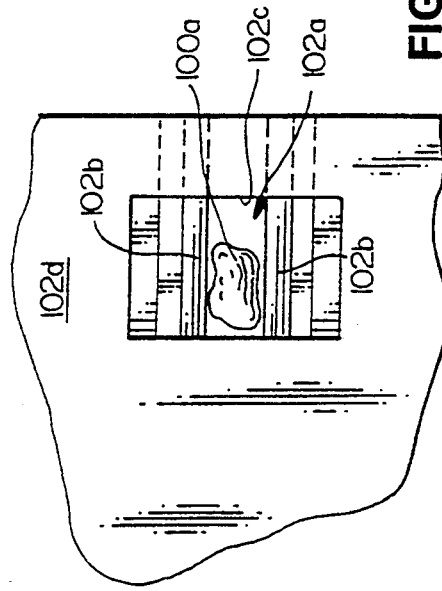

Referring to FIGS. 16A and 16B, in a typical configuration (only a single conductive path is illustrated although plural conductors are generally used), the solder 100a is placed in a recessed pocket 102a. The illustrated recessed pocket is formed by the inclined side walls 102b of the conductive path, and either a third terminal ending side wall 102c (FIG. 16B) and dielectric insulating layer 102d, or a dielectric layer 102d blocking both ends 102e of the pocket (FIG. 16A). In either configuration, heat is then applied, the solder melts in place, and the device terminal is inserted for electrical connection to the conductive path 102f. Alternatively the blocking members can be omitted, if desired.

Figure 17:
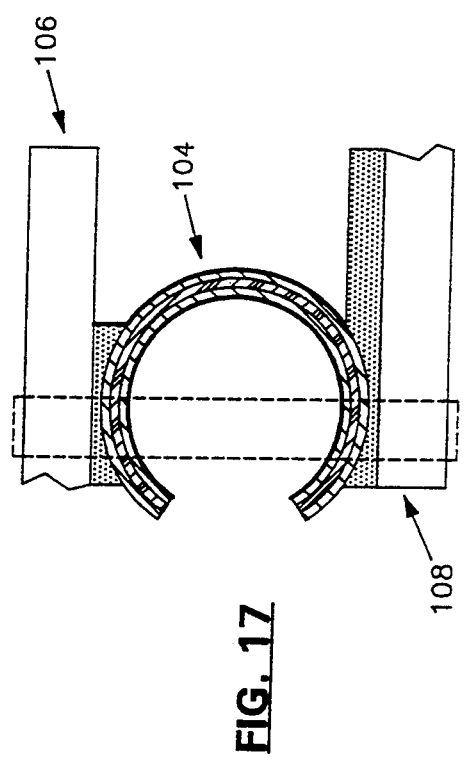
FIG. 17 is an elevation view of a flexible conductive network formed into a "C" configuration for interconnecting two printed circuit boards.

Referring now to FIG. 17, it can be seen that the flexible circuit of this invention can be used to interconnect the conductive paths of circuit boards which are in a multi-layer configuration. Flexible conductive network 104, for example, a circuit connection having over one hundred conductors within a one inch connector width and backed with a spring member, is formed into a "C" configuration which can be sandwiched between two printed circuit boards 106, 108 to interconnect required signals from the conductive paths of the different circuit boards. This configuration offers a compliant, self-aligning low cost interconnect.

Figure 18A:
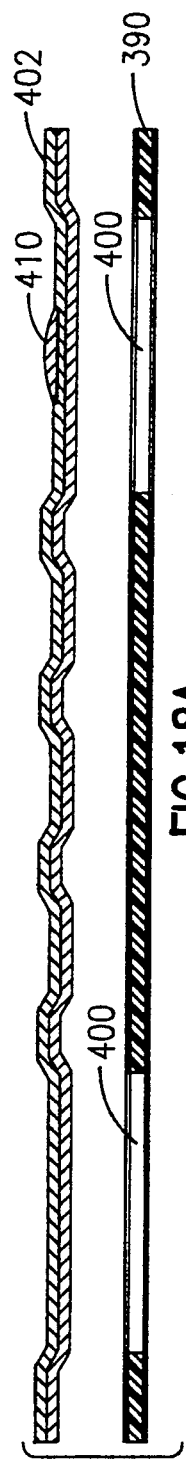
FIGS. 18A, 18B, 18C, 18D, and 18E are sectional views illustrating a cold pressure fusing operation.
Figure 18B:
Figure 18C:
Figure 18D:
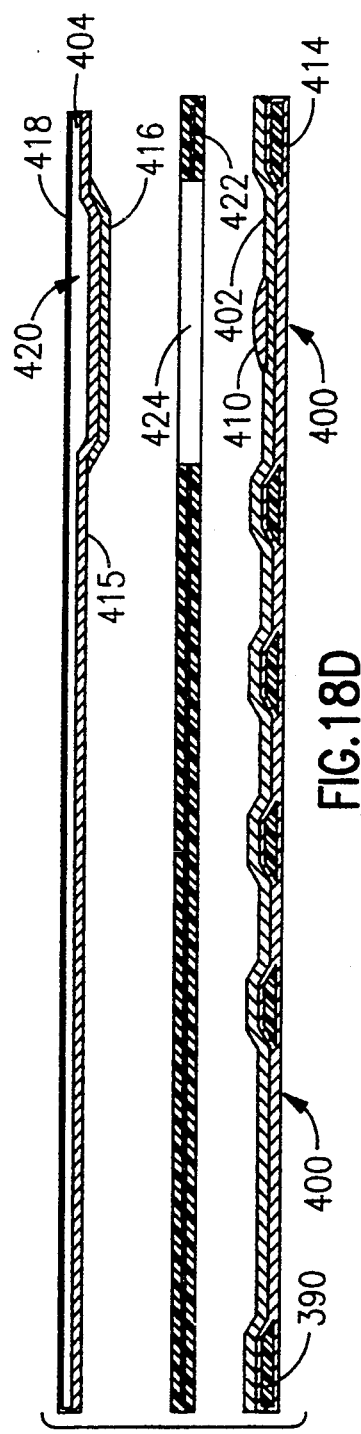

Referring to FIG. 18A, according to one particularly preferred implementation of a pressure fused interconnection between two conductive sheets, in accordance with the invention, a dielectric 390, for example 0.001 inches Kapton with polyester adhesive on either side, is prepunched at 400 to allow a connection between a gold plated copper foil 402 and a conductive shield material 404 (FIG. 18D). In this process, the copper foil is provided with a force concentrator 410 at the location where the pressure fused interconnect is to be made. The force concentrator has been stress hardened and may be back filled with adhesive to further increase its strength and insure its ability to fuse without collapsing. The prewindowed Kapton is laminated to the formed copper (see FIG. 18B) and, in accordance with the manufacturing process described above, the upper surface layer of the copper laminate is ground off (FIG. 18C). The force concentrator 410 has a height preferably below the level of grinding so that it neither interferes with the grinding process nor is itself ground.

Figure 18E:
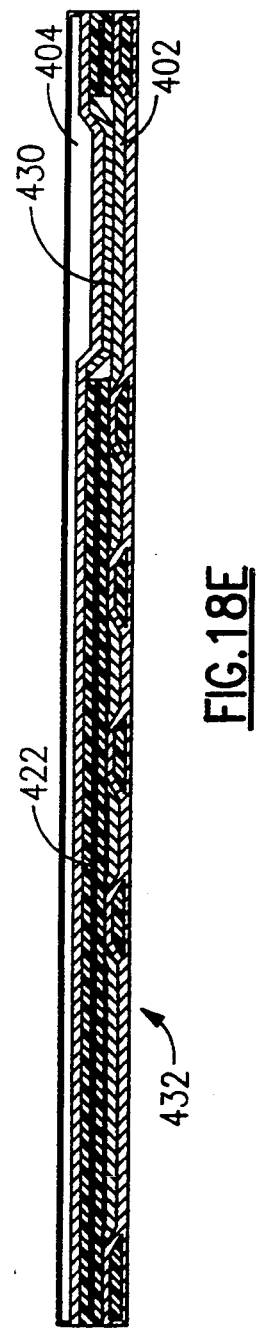

Referring to FIG. 18D, the thus formed conductor circuit with force concentrator(s) 414 is assembled with the shield material 404 formed, for example, of a copper sheet 415 having a plated interconnect point 416 and an insulating layer 418 connected to the shield material through an adhesive layer 420. A prewindowed adhesive layer 422, windowed or drilled at 424 to expose the interconnect point 416, is placed between the shield material and the formed circuit 414 and the assembly is laminated in place. During the lamination process, the force concentrator effectively increases substantially the force between the plated interconnect point 416 of the shield and the conductor 402 of the formed circuit 414 to effect a pressure fused interconnection at 430 for the assembled circuit 432 (FIG. 18E). Typical pressure required for this interconnection is on the order of 275-425 psi. In this manner, according to this illustrated embodiment, a conductor of the invention can be connected to a shielding member with its advantageous electrical properties.

Additions, subtractions, deletions and other modifications of the described embodiments will be apparent to those practiced in the art and are within the scope of the following claims.

What is claimed is:

1. A method for manufacturing a conductive network comprising the steps of forming a planar metallic sheet into a non-planar pattern having
   a dielectric material on a first side of said metallic sheet; and
   removing raised portions of said metallic sheet from a second side of said metallic sheet to form electrically insulated conductive paths.

2. The method of claim 1 further comprising the step of adhering a sheet of spring material to said dielectric material.

3. The method of claim 1 further wherein said removing step comprises the step of grinding said raised portions of said sheet.

4. The method of claim 1 further wherein said forming step comprises the step of coining said metallic sheet.

5. The method of claim 1 further wherein said adhering step comprises the step of fusing said flexible dielectric material to said metallic sheet.

6. The method of claim 1 wherein said planar metallic sheet contains minor inclusions.

7. The method of claim 1 further comprising the steps of adhering the dielectric material to the first side and simultaneously performing said forming and adhering steps.

8. A method for fabricating an interconnection between two conductive materials comprising the steps of:

forming a planar metallic sheet into a non-planar pattern;
   adhering a flexible dielectric material to a first side of said metallic sheet;
   removing raised portions of said metallic sheet from a second side of said metallic sheet to form electrically insulated conductive paths;
   providing at least one window in an insulating layer;
   adhering a conductive sheet material to said insulating layer; and
   cold pressure fusing a conductive path and said conductive sheet through said insulating layer window.

9. The method of claim 8 wherein said fusing step further comprises the steps of developing a stress hardened, adhesive filled force concentrator to one of said conductive sheet and said conductive path; and
   laminating an assembled combination of said conductive sheet and said conductive path for cold pressure fusing said sheet through said dielectric window.

10. The method of claim 8 wherein said conductive sheet is an electrical shielding material.

11. The method of claim 8 further comprising the step of providing at least one window in said flexible dielectric material adhered to said first side of said metallic sheet.

12. The method of claim 8 further comprising the step of simultaneously performing said forming step and said first adhering step.

13. A method for manufacturing a conductive network comprising the steps of forming a planar metallic sheet into a non-planar pattern;
   adhering a dielectric material to a first side of said metallic sheet;

removing raised portions of said metallic sheet from a second side of said metallic sheet to form electrically insulated recessed conductive paths; and blocking at least one of said conductive paths to isolate at least one pad portion of a path for receiving a solder volume.

14. The method of claim 13 wherein said blocking step comprises the step of filling portions of said conductive path with a blocking material to define said pad portion.

15. The method of claim 13 wherein said blocking step comprises the step of forming said planar sheet, during the forming step, to block at least one lateral extent of said conductive path.

16. The method of claim 15 further comprising the steps of providing solder to each pad portion; and soldering a device to selected conductive paths at said pad portions for electrically connecting said device in a circuit configuration with said network.

17. A method for manufacturing a conductive network comprising the steps of forming a planar metallic sheet into a non-planar pattern;

adhering a dielectric material to a first side of said metallic sheet;

removing raised portions of said metallic sheet from a second side of said metallic sheet to form electrically insulated recessed conductive paths; and providing at least one of said conductive paths with a solder volume at a portion thereof.

18. The method of claim 17 further comprising the step of soldering a device to selected conductive paths at said portions for electrically connecting said device in a circuit configuration with said network.

19. A method for manufacturing a conductive network comprising the steps of forming an electrically conducting material into a non-planar pattern;

adhering a dielectric material to a first side of said material; and removing raised portions of said conducting material from a second side of said conducting material to form electrically insulated conductive paths.

20. The method of claim 19 wherein said removing step comprises removing said material until said conducting material and said dielectric material have a coplanar surface, and said conducting material has a planar configuration.

21. A method for manufacturing a supported conductive network comprising the steps of:

a) forming a planar electrically conductive sheet into a non-planar pattern having a dielectric material fast with a first face thereof; and b) removing portions of the sheet from a second face thereof to form electrically insulated electrically conductive paths supported by the dielectric material.

22. The method of claim 21 wherein the dielectric material is made fast with the first face of the sheet after the forming step.

23. The method of claim 21 wherein the forming step forms ridges and troughs on both said faces.

24. The method of claim 23 comprising adhering the dielectric material to the first face by an adhesive which also serves to fill voids between the dielectric material and the first face.

25. The method of claim 22 wherein the forming step forms a raised said pattern on the first face only and the portions removed form said paths from said raised pattern.

26. The method of claim 25 wherein the sheet is one of copper, a laminate comprising a relatively thin copper layer defining the first face and a relatively thick aluminum layer defining the second face, a laminate comprising layers of two different electrically conductive materials, a laminate comprising a relatively thin electrically conductive metal layer defining the first face and a relatively thick dielectric layer defining the second face, a laminate comprising a layer of electrically conductive material defining the first face and a layer of dielectric material defining the second face.

27. The method of claim 21 wherein the forming step and application of the dielectric material are performed simultaneously.

28. The method of claim 21 wherein the removing step is a machining operation.

29. The method of claim 26 wherein the planar sheet is a flexible laminate comprising an electrically conductive layer and a dielectric layer.

30. The method of claim 29 wherein the forming step forms ridges and troughs on both faces of the laminate.

31. The method of claim 29 wherein the conductive layer is attached to a flexible said dielectric layer by an adhesive and the adhesive is displaced in the forming step to allow the formation into a non-planar pattern and to fill voids otherwise formed between the layers.

32. The method of claim 21 comprising the step of making fast a second electrically conductive material to the dielectric material remote from the paths.

33. The method of claim 32 wherein the electrically conductive material is a spring material.

34. The method of claim 22 wherein the forming step is achieved by drawing the sheet against a suitably contoured surface and the dielectric material is applied to the sheet while the sheet is so drawn.

35. A method for manufacturing a supported conductive network comprising the steps of:

a) providing a flexible laminate having an electrically conductive layer and a dielectric layer, the laminate being sufficiently pliable to be deformed by a partial vacuum to define a non-planar pattern;

b) applying such a partial vacuum to the dielectric layer to draw a first face of the laminate against an appropriately contoured surface forming the laminate into a non-planar pattern; and c) removing portions of the laminate from a second face thereof to form electrically insulated electrically conductive paths supported by the dielectric material.

36. The method of claim 35 wherein the laminate is chosen to be sufficiently resilient to return to a planar form when released from the contoured surface subsequent to removal of the portions.

37. The method of claim 35, comprising the further step of pressing the deformed laminate into a planar form after the portions are removed and after release of the laminate from the contoured surface.

38. The method of claim 37 wherein the raised portions are removed while the laminate is held against the contoured surface by the partial vacuum.

39. A method for manufacturing a supported conductive network comprising the steps of:

a) providing a planar electrically conductive sheet
b) forming a non-planar pattern in said planar electrically conductive sheet, and providing a dielectric material fast with a first face of said sheet;
c) removing portions of the sheet from a second face thereof to form electrically insulated electrically conductive recessed paths supported by the dielectric material; and
d) blocking at least one of said recessed conductive paths to isolate at least one pad portion of a path for receiving a solder volume.

40. A method for manufacturing a supported conductive network comprising the steps of:
a) providing a planar electrically conductive sheet
b) forming a non-planar pattern in said planar electrically conductive sheet, and providing a dielectric material fast with a first face of said sheet;
c) removing portions of the sheet from a second face thereof to form a plurality of electrically insulated electrically conductive recessed paths supported by the dielectric material;
d) providing a spring layer overlapping at least a portion of said dielectric layer;
e) shaping a first end of said conductive paths to form a contact region having at least one pair of parallel, spaced apart, clip arms oriented parallel to a common axis;
f) orienting a second end of said conductive paths to form a clip member for mechanically interlocking with conductive contacts of a connecting member;
g) providing connection of one or more circuit elements to selected conductive paths in a circuit configuration.

41. A method for manufacturing a supported conductive network comprising the steps of:
a) providing a planar electrically conductive sheet;
b) forming a non-planar pattern in said planar electrically conductive sheet, and providing a dielectric material fast with a first face of said sheet, wherein the forming step and application of the dielectric material are performed simultaneously by molding the dielectric material onto the first face with the molding pressure serving to deform the planar sheet into the non-planar pattern; and
c) removing portions of the sheet from a second face thereof to form electrically insulated electrically conductive paths supported by the dielectric material.

42. A method for manufacturing a supported conductive network comprising the steps of:
a) providing a planar electrically conductive sheet;
b) forming a non-planar pattern in said planar electrically conductive sheet, and providing a dielectric material fast with a first face of said sheet;
c) removing portions of the sheet from a second face thereof to form electrically insulated electrically conductive paths supported by the dielectric material;
d) making fast a second electrically conductive material to the dielectric material remote from the paths; and
e) providing a window in said dielectric material and cold pressure fusing a conductive path and said electrically conductive material together through said window.

43. The method of claim 42 wherein said fusing step further comprises the steps of
developing a stress hardened, adhesive filled force concentrator to one of said conductive material and said conductive path; and
laminating an assembled combination of said conductive material and said conductive path using said concentrator for cold pressure fusing said sheet through said dielectric window.

44. A method for manufacturing a conductive network comprising the steps of
a) providing a planar electrically conductive sheet;
b) forming said electrically conductive sheet into a non-planar pattern;
c) providing a layer of dielectric material fast on a first side of said electrically conductive sheet; and
d) removing portions of said electrically conductive sheet from a second side of said electrically conductive sheet to form electrically insulated conductive paths.

45. A method according to claim 44, wherein step b) is performed before step c).

46. A method according to claim 44, wherein step c) is performed before step b).

47. A method according to claim 44, wherein steps b) and c) are performed simultaneously.

48. A method according to claim 45 comprising forming of at least one surface of the dielectric material into a non-planar pattern, corresponding to and in intimate contact with the non-planar pattern of the electrically conductive sheet, subsequent to the formation of the non-planar pattern of the electrically conductive sheet.

49. A method according to claim 46 comprising forming of at least one surface of the dielectric material into a non-planar pattern, corresponding to and in intimate contact with the non-planar pattern of the electrically conductive sheet, simultaneously with the formation of the non-planar pattern of the electrically conductive sheet.

50. A method according to claim 47 comprising forming of at least one surface of the dielectric material into a non-planar pattern, corresponding to and in intimate contact with the non-planar pattern of the electrically conductive sheet, simultaneously with the formation of the non-planar pattern of the electrically conductive sheet.

* * * * *

REEXAMINATION CERTIFICATE (3697th)

United States Patent [19]

Roberts

[11] B1 5,343,616

[45] Certificate Issued Dec. 29, 1998

[54] METHOD OF MAKING HIGH DENSITY SELF-ALIGNING CONDUCTIVE NETWORKS AND CONTACT CLUSTERS

[75] Inventor: Joseph A. Roberts, Hudson, N.H.

[73] Assignee: Rock Ltd., Grafton, N.H.

Reexamination Request:
No. 90/004,760, Sep. 25, 1997

Reexamination Certificate for:
Patent No.: 5,343,616
Issued: Sep. 6, 1994
Appl. No.: 837,357
Filed: Feb. 14, 1992

[51] Int. Cl.[6] ............................................. H05K 3/02
[52] U.S. Cl. .................... 29/846; 29/847; 29/881; 174/259; 174/255; 439/67; 439/77; 439/85
[58] Field of Search ........................... 29/846, 847, 881, 29/469.5; 174/254, 255, 253, 52.2, 52.4; 439/67, 74, 77, 85

[56] References Cited

U.S. PATENT DOCUMENTS 4,912,844   4/1990   Parker.

*Primary Examiner*—Carl J. Arbes

[57] ABSTRACT

A conductive network, which can be flexible or rigid, can have self-aligning conductors which connect with corresponding conductors of other networks. The conductive network can be fabricated into densely packed contact clusters for use as electrical interconnectors or circuits. The contact clusters, which can be configured to substantially any shape, are the essential components of high density connector assemblies. The methods and apparatus for making the conductive network and cluster contacts are also described.

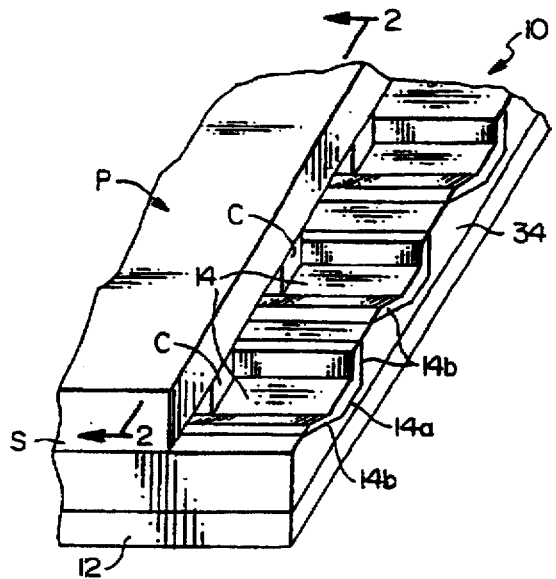

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 8–16 and 35–43 is confirmed.

Claims 2, 17, 18, 19, 21, 22, 23 and 44–50 are cancelled.

Claims 1, 20, 24, 25, 27, 28, 32 and 34 are determined to be patentable as amended.

Claims 3–7, 26, 29–31 and 33, dependent on an amended claim, are determined to be patentable.

New claims 51 and 52 are added and determined to be patentable.

1. A method for manufacturing a conductive network comprising the steps of forming a planar metallic sheets into a non-planar pattern having a dielectric material on a first side of said metallic sheet; [and]

removing raised portions of said metallic sheet from a second side of said metallic sheet to form electrically insulated conductive paths; *and*

*adhering a sheet of spring material to said dielectric material.*

20. [The method of claim 19 wherein said removing step comprises] *A method for manufacturing a conductive network comprising the steps of:*

*forming an electrically conducting material into non-planar pattern;*

*adhering a dielectric material to a first side of said material;*

*removing raised portions of said conducting material from a second side of said conducting material to form electrically insulated conductive paths; and* removing said material until said conducting material and said dielectric material have a coplanar surface, and said conducting material has a planar configuration.

24. [The method of claim 23 comprising] *A method for manufacturing a supported conductive network comprising the steps of:*

*a) forming a planar electrically conductive sheet into a non-planar pattern having a dielectric material fast with a first face thereof;*

*b) removing portions of the sheet from a second face thereof to form electrically insulated electrically conductive paths supported by the dielectric material;*

*c) the forming step forms ridges and troughs on both said faces; and*

*d) adhering the dielectric material to the first face by an adhesive which also serves to fill voids between the dielectric material and the first face.*

25. [The method of claim 22 wherein the] *A method for manufacturing a supported conductive network comprising the steps of:*

*a) forming a planar electrically conductive sheet into a non-planar pattern having a dielectric material fast with a first face thereof;*

*b) removing portions of the sheet from a second face thereof to form electrically insulated electrically conductive paths supported by the dielectric material;*

*c) making the dielectric material fast with the first face of the sheet after the forming step; and*

*d) the forming step forms a raised said pattern on the first face only and the portions removed form said paths from said raised pattern.*

27. The method of claim [21] *24* wherein the forming step and application of the dieletric material are performed simultaneously.

28. The method of claim [21] *24* wherein the removing step is a machining operation.

32. The method of claim [21] *24* comprising the step of making fast a second electrically conductive material to the dielectric material remote from the paths.

34. The method of claim [22] *25* wherein the forming step is achieved by drawing the sheet against a suitably contoured surface and the dielectric material is applied to the sheet while the sheet is so drawn.

*51. A method for manufacturing a conductive network comprising the steps of:*

*a) providing a planar electrically conductive sheet;*

*b) providing a layer of dielectric material fast on a first side of said electrically conductive sheet;*

*c) forming said electrically conductive sheet into a non-planar pattern;*

*d) removing portions of said electrically conductive sheet from a second side of said electrically conductive sheet to form electrically insulated conductive paths; and*

*e) forming of at least one of surface of the dielectric material into a non-planar pattern, corresponding to and in intimate contact with the non-planar pattern of the electrically conductive sheet simultaneously with the formation of the non-planar pattern of the electrically conductive sheet.*

*52. A method for manufacturing a conductive network comprising the steps of:*

*a) providing a planar electrically conductive sheet;*

*b) providing a layer of dielectric material fast on a first side of said electrically conductive sheets while simultaneously forming said electrically conductive sheet into a non-planar pattern;*

*c) removing portions of said electrically conductive sheet from a second side of said electrically conductive sheet to form electrically insulated conductive paths; and*

*d) forming of at least one surface of the dielectric material into a non-planar pattern, corresponding to and in intimate contact with the non-planar pattern of the electrically conductive sheet, simultaneously with the formation of the non-planar pattern of the electrically conductive sheet.*

* * * * *